(12) United States Patent
Lv et al.

(10) Patent No.: US 11,245,074 B2
(45) Date of Patent: Feb. 8, 2022

(54) RESISTANCE RANDOM ACCESS MEMORY AND METHOD FOR FABRICATING THE SAME

(71) Applicant: INSTITUTE OF MICROELECTRONICS, CHINESE ACADEMY OF SCIENCES, Beijing (CN)

(72) Inventors: Hangbing Lv, Beijing (CN); Ming Liu, Beijing (CN); Shibing Long, Beijing (CN); Qi Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 84 days.

(21) Appl. No.: 16/616,785

(22) PCT Filed: May 26, 2017

(86) PCT No.: PCT/CN2017/086084
§ 371 (c)(1),
(2) Date: Nov. 25, 2019

(87) PCT Pub. No.: WO2018/214142
PCT Pub. Date: Nov. 29, 2018

(65) Prior Publication Data
US 2021/0175420 A1 Jun. 10, 2021

(51) Int. Cl.
*H01L 45/00* (2006.01)
*H01L 27/24* (2006.01)

(52) U.S. Cl.
CPC ...... *H01L 45/1253* (2013.01); *H01L 27/2436* (2013.01); *H01L 27/2463* (2013.01);
(Continued)

(58) Field of Classification Search
CPC .......... H01L 45/1233; H01L 45/146; H01L 45/1641
See application file for complete search history.

(56) References Cited

U.S. PATENT DOCUMENTS

| 8,450,715 B2 * | 5/2013 | Takano | H01L 45/08 257/4 |
| 2019/0115533 A1 * | 4/2019 | Borowski | H01L 45/1233 |

FOREIGN PATENT DOCUMENTS

| CN | 101159309 | 4/2008 |
| CN | 101989644 | 3/2011 |

(Continued)

OTHER PUBLICATIONS

International Search Report and Written Opinion, issued in the corresponding PCT application No. PCT/CN2017/086084, dated Feb. 24, 2018, 14 pages.

*Primary Examiner* — Mark V Prenty
(74) *Attorney, Agent, or Firm* — Hamre, Schumann, Mueller & Larson, P.C.

(57) ABSTRACT

A RRAM and a method for fabricating the same, wherein the RRAM comprises: a bottom electrode; an oxide layer containing a bottom electrode metal, disposed on the bottom electrode; a resistance-switching layer, disposed on the oxide layer containing a bottom electrode metal, wherein the resistance-switching layer material is a nitrogen-containing tantalum oxide; an inserting layer, disposed on the resistance-switching layer, wherein the inserting layer material comprises a metal or a semiconductor; a top electrode, disposed on the inserting layer. By providing the to resistance-switching layer with a nitrogen-containing tantalum oxide, compared with $Ta_2O_5$, the RRAM of the present disclosure has a low activation voltage and a high on-off ratio, and can enhance the control capability over the device resistance by the number of oxygen vacancies.

10 Claims, 5 Drawing Sheets

(52) U.S. Cl.
CPC .......... *H01L 45/08* (2013.01); *H01L 45/1233* (2013.01); *H01L 45/146* (2013.01); *H01L 45/1625* (2013.01); *H01L 45/1633* (2013.01)

(56) References Cited

FOREIGN PATENT DOCUMENTS

| | | |
|---|---|---|
| CN | 102623638 | 8/2012 |
| CN | 103151459 | 3/2013 |

* cited by examiner

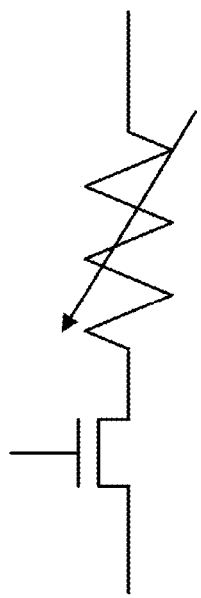
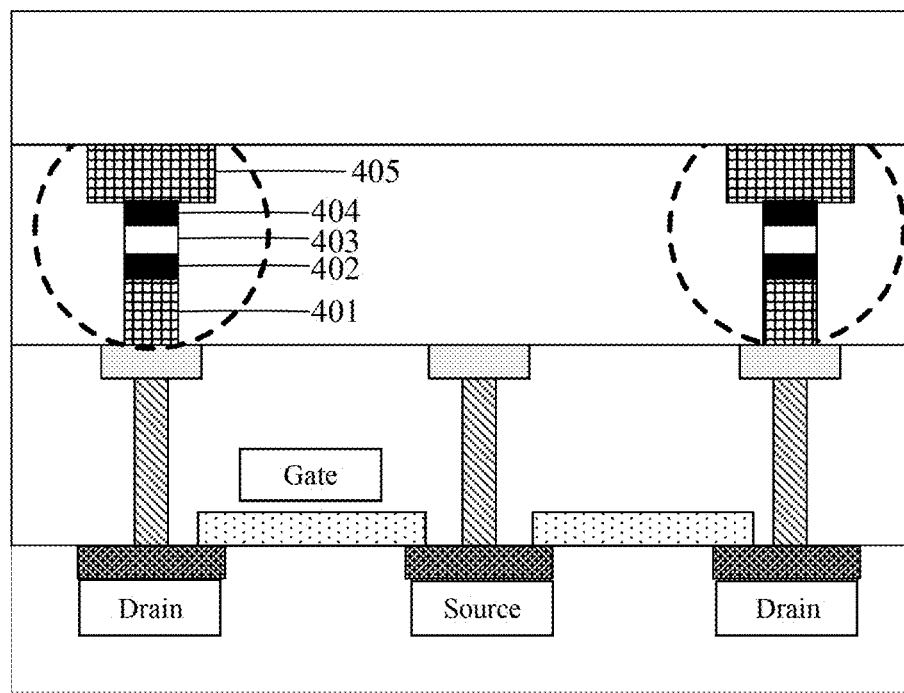
Fig. 4A
Fig. 4B
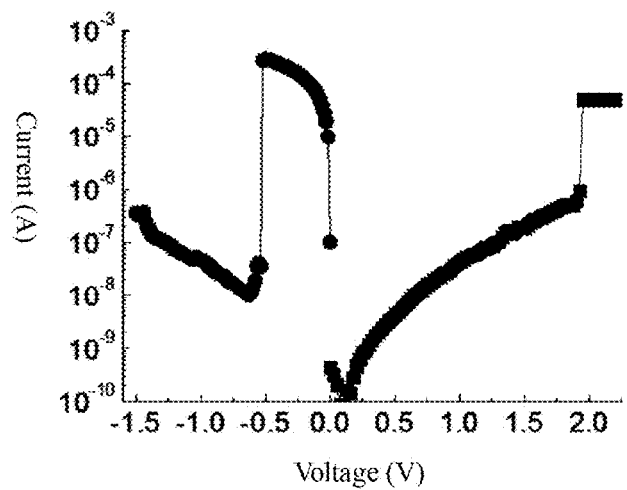
Fig. 5

RESISTANCE RANDOM ACCESS MEMORY AND METHOD FOR FABRICATING THE SAME

TECHNICAL FIELD

The present disclosure relates to the field of memory, and further to a resistance random access memory and a method for fabricating the same.

BACKGROUND

Resistance random access memory (RRAM) is a new type of non-volatile memory. It has wide application in embedded applications and to stand-alone applications due to simple-structured storage cell, high speed, power saving and stable information retention. RRAM uses the reversible switching of material resistivity to store binary data. At present, there are still some problems mainly in reliability, for example, retention and device yield need to be further improved and an activation voltage needs to be further reduced.

In the prior art, a programming process of a $TaO_x$-based RRAM is similar to the breakdown of a dielectric which forming oxygen vacancies (i.e., conductive paths) within the $Ta_2O_5$ film. But the art has a problem of a high activation voltage and a low on-off ratio.

SUMMARY

Accordingly, the present disclosure aims to provide a RRAM to solve at least one of the technical problems described above.

According to an aspect of the present disclosure, there is provided a RRAM, comprising:

a bottom electrode;

an oxide layer containing a bottom electrode metal, disposed on the bottom electrode;

a resistance-switching layer, disposed on the oxide layer containing a bottom electrode metal, wherein the resistance-switching layer material comprise a nitrogen-containing tantalum oxide;

an inserting layer, disposed on the resistance-switching layer, wherein the inserting layer material comprise a metal or a semiconductor;

a top electrode, disposed on the inserting layer.

Further, wherein a material of the bottom electrode comprises W, and a material of the oxide layer containing a bottom electrode metal comprises $WO_x$ where X is ranging from 1 to 3.

Further, wherein the oxide layer containing a bottom electrode metal has a thickness ranging from 1 nm to 30 nm.

Further, wherein the nitrogen atom content of the nitrogen-containing tantalum oxide is ranging from 0.05% to 30%.

Further, wherein the resistance-switching layer has a thickness ranging from 1 nm to 20 nm.

Further, wherein the inserting layer material is one of the following types:

Ta, TaN, Ti, TiN, Ru or Ir; two or more metals of Ta, TaN, Ti, TiN, Ru and Ir; a metallic oxide containing Ta, TaN, Ti, TiN, Ru or Ir; an oxide of two or more metals of Ta, TaN, Ti, TiN, Ru and Ir; an amorphous silicon; an amorphous carbon; or a graphene.

According to another aspect of the present disclosure, there is provided a method for fabricating a RRAM, comprising: forming a bottom electrode;

forming a oxide layer containing a bottom electrode metal on the bottom electrode;

forming a resistance-switching layer on the oxide layer containing a bottom electrode metal, wherein a resistance-switching layer material comprises a nitrogen-containing tantalum oxide;

forming an inserting layer on the resistance-switching layer, wherein an inserting layer material comprises a metal or a semiconductor;

forming the top electrode on the inserting layer.

Further, the oxide layer containing a bottom electrode metal is formed by way of sputtering or thermal oxidation.

Further, a method for forming the resistance-switching layer comprises: forming the nitrogen-containing tantalum oxide on the oxide layer containing a bottom electrode metal by reactive sputtering; or forming the nitrogen-containing tantalum oxide on the oxide layer containing a bottom electrode metal in an oxygen-containing or oxygen plasma atmosphere by thermal oxidation; or forming the nitrogen-containing tantalum oxide on the oxide layer containing a bottom electrode metal in an atmosphere containing oxygen and nitrogen by thermal oxidation; Further, wherein the inserting layer material comprises Ta and the inserting layer has a thickness ranging from 0.1 nm to 10 nm.

By providing the oxide layer containing a bottom electrode metal as an oxygen storage layer, the RRAM of the present disclosure provides sufficient oxygen during the erasing operation of the memory cell and avoid oxygen depletion thereby improve the fatigue characteristics of the device, and The oxide layer containing a bottom electrode metal may be formed by thermal oxidation thereby eliminating the gap problem when forming a tungsten (W) plug via chemical mechanical polishing;

By providing the resistance-switching layer with nitrogen-containing tantalum oxide, compared with $Ta_2O_5$, the RRAM of the present disclosure has a low activation voltage and a high on-off ratio, and can enhance the control capability over the device resistance by the number of oxygen vacancies. A small amount of oxygen vacancies generated can result in a great change in device resistance, reducing the activation voltage while increasing the on-off ratio;

By providing an inserting layer, the RRAM of the present disclosure can generate oxygen ions during the surface retention operation to improve the fatigue characteristics of the device while keep the selection of the top electrode unlimited.

BRIEF DESCRIPTION OF THE DRAWINGS

FIGS. 4A and 4B illustrate respectively an equivalent circuit diagram and a cross-sectional diagram of a memory cell of a RRAM according to an embodiment of the present disclosure.

FIG. 5 illustrates a current-voltage curve of a $Ta_2O_5$-based RRAM.

DETAILED DESCRIPTION

Figure 1:
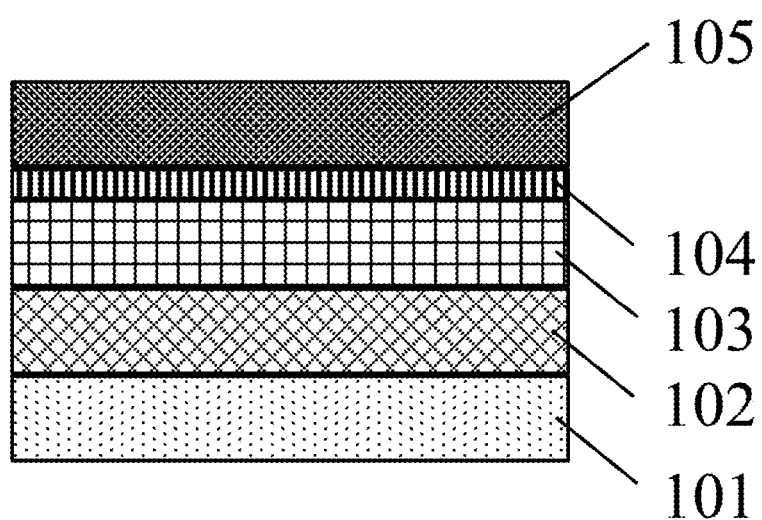
FIG. 1 illustrates a structural diagram of a RRAM according to an embodiment of the present disclosure.

In order to make the purpose, technical solution and advantages of the present disclosure more apparent, the present disclosure will be further described in detail below in connection with specific embodiments and with reference to the accompanying drawings. The accompanying drawings are simplified and used as illustrations. The number, shape and size of the various layers shown in the drawings may be modified depending on the actual situation, and the configuration of the components may be more complicated. The present disclosure may be applied to other aspects of practice or application, and may be changed and adjusted in various manners without departing from the spirit and scope of the present disclosure.

In the present disclosure, "located on", "forming on", "formed on" and "disposed on" include contact and non-contact with a single or multiple layers. It may be indicated that one layer is formed or disposed directly on another layer, or that one is formed or disposed indirectly on another layer, that is, there may be other layers between the two layers.

According to the basic concept of the present disclosure, there is provided a RRAM, wherein the RRAM adds nitrogen to a tantalum oxide dielectric layer on the basis of the initial metal-insulator-metal (MIM) structure, which can lower the activation voltage and increase the on-off ratio.

FIG. 1 illustrates a structural diagram of a RRAM according to an embodiment of the present disclosure. As shown in FIG. 1, according to an aspect of the present disclosure, there is provided a RRAM, comprising:

a bottom electrode 101;

an oxide layer 102 containing a bottom electrode metal, disposed on the bottom electrode 101;

a resistance-switching layer 103, disposed on the oxide layer 102 containing a bottom electrode metal, wherein the resistance-switching layer 103 material comprises a nitrogen-containing tantalum oxide;

an inserting layer 104, disposed on the resistance-switching layer 103, wherein the inserting layer material comprises a metal oxide and a conductive carbon material;

a top electrode 105, disposed on the inserting layer 104.

Wherein the bottom electrode 101 may be formed on a substrate which may be a semiconductor or a compound semiconductor. The substrate also may be a MOS circuit. The bottom electrode 101 can electrically connected to the MOS circuit through a plug. The bottom electrode 101 material comprises metal materials, which may be inert metals or inert metal compounds under electric field, including but not limited to: W, Ti, TiN, Ta, TaN, etc., preferably using W as the bottom electrode in the embodiment of the present disclosure. The thickness of the bottom electrode 101 may be selected ranging from 1 nm to 100 nm.

Wherein the oxide layer 102 containing a bottom electrode metal is formed on the bottom electrode 101. The purpose of the oxide layer 102 containing a bottom electrode metal is that it may act as an oxygen storage layer to provide sufficient oxygen during the erasing operation of the memory cell and avoid oxygen depletion thereby improving the fatigue characteristic of the device; and it may eliminate the seam problem (i.e., the hollow problem) when forming a W plug by chemical mechanical polishing (CMP).

The oxide layer 102 containing a bottom electrode metal is determined according to the bottom electrode 101 materials. For example, if the bottom electrode 101 material is W, the oxide layer 102 containing a bottom electrode metal material is an oxide of W, and the chemical formula thereof is $WO_x$, which may be a $WO_3$ with a complete chemical composition ratio, or a $WO_x$ with a non-complete chemical composition ratio, where x is ranging from 1 and 3. The oxide layer 102 containing a bottom electrode metal has a thickness ranging from 1 nm to 30 nm, preferably, ranging from 5 nm to 10 nm.

Wherein the resistance-switching layer 103 is formed on the oxide layer 102 containing a bottom electrode metal, which is to improve the existing Ta-based resistance-switching layer by adding other elements to tantalum oxide thereby having a low activation voltage and a high on-off ratio compared with $Ta_2O_5$. The embodiment of the present disclosure provides the resistance-switching layer 103 with a nitrogen-containing tantalum oxide material to improve the activation energy of O ion due to existing of an N ion center on the one hand, and enhance the control capability over the device resistance by the number of oxygen vacancies on the other hand.

The nitrogen-containing tantalum oxide has a nitrogen content ranging from 0.05% to 30%, preferably, 1% to 10%.

The resistance-switching layer 103 has a thickness ranging from 1 nm to 30 nm, preferably, 3 nm to 10 nm.

The inserting layer 104 is formed on the resistance-switching layer. The material of the inserting layer 104 may be a metal, including but not limited to Ta, TaN, Ti, TiN, Ir, Al or Ru, and can also be a semiconductor, including but not limited to metal oxide, amorphous silicon, amorphous carbon or graphene. Preferably, the inserting layer may be TaN inserting layer, which is to generate oxygen ions during the surface retention operation to improve the fatigue characteristics of the device while keep the selection of the top electrode unlimited.

The inserting layer 104 can have a thickness ranging from 0.1 nm to 10 nm, preferably, 0.5 nm to 5 nm.

Figure 2:
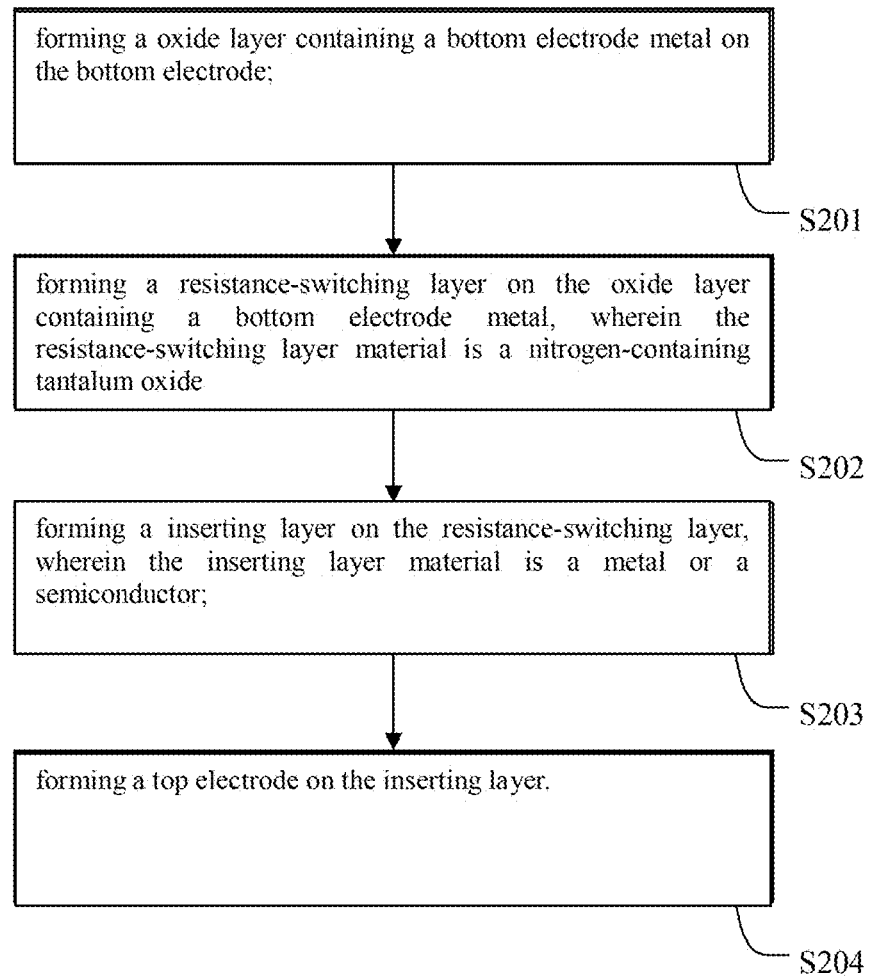
FIG. 2 illustrates a process diagram of a method for fabricating a RRAM according to an embodiment of the present disclosure.

FIG. 2 illustrates a process diagram of a method for fabricating a RRAM according to an embodiment of the present disclosure. As shown in FIG. 2, according to another aspect of the present disclosure, there is provided a method for fabricating a RRAM, comprising the following steps:

S201: forming the oxide layer containing a bottom electrode metal on the bottom electrode;

S202: forming the resistance-switching layer on the oxide layer containing a bottom electrode metal, wherein the resistance-switching layer material is a nitrogen-containing tantalum oxide;

S203: forming the inserting layer on the resistance-switching layer, wherein the inserting layer material is a metal or a semiconductor;

S204: forming the top electrode on the inserting layer.

Before step S201, it can comprise the steps of forming the bottom electrode and the bottom electrode may be formed on a substrate which may be a semiconductor or a compound semiconductor. The substrate may also be a MOS circuit. The bottom electrode can electrically connected to the MOS circuit through a plug. Preferably, the embodiment of the present disclosure uses tungsten (W) as the bottom electrode. The thickness of the bottom electrode may be selected from 1 nm to 100 nm. The bottom electrode may be formed by atomic layer deposition, sputtering, vapor phase evaporation or chemical vapor deposition. The material of the bottom electrode includes a metal, which may be inert metals or insert metal compounds in an electric field, including but not limited to W, $Ta_2O_5$, Pt or Au.

Figure 3:
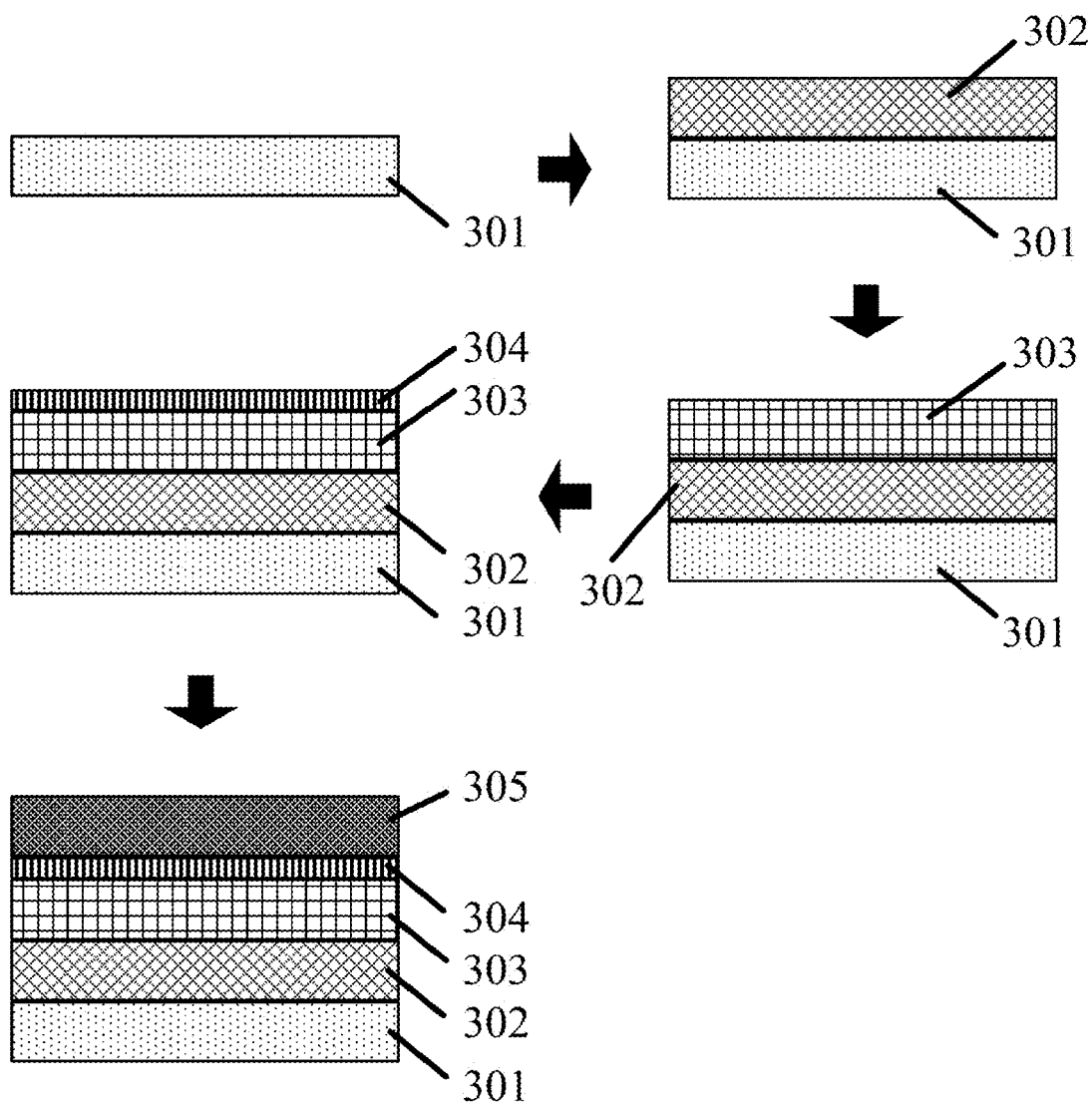
FIG. 3 illustrates a structural diagram during the process shown in FIG. 2.

Step S201, as shown in FIG. 2 and FIG. 3, wherein FIG. 3 is the structural diagram during the process shown in FIG. 2, the oxide layer 302 containing a bottom electrode metal is formed on the bottom electrode 301. The oxide layer 302 containing a bottom electrode metal is determined according to the bottom electrode 301 materials. If the bottom electrode 301 material is W, $WO_x$ is formed on W of the bottom electrode 301.

The oxide layer 302 containing a bottom electrode metal may be formed by a reactive sputtering process and deposited on the bottom electrode, for example, a $WO_x$, x is ranging from 1 and 3, and the $WO_x$ may be a $WO_3$ with a complete chemical composition ratio, or a $WO_x$ with a non-complete chemical composition ratio. The $WO_x$ may be sputtered by $WO_3$ alloy target or W metal target reactive sputtering, the chemical composition ratio may be controlled by adjusting the flow ratio of $Ar/O_2$ (the flow ratios of different sputtering machines are different and there is not limited) in which the $WO_x$ has a thickness ranging from 1 nm to 50 nm. Alternatively, the bottom electrode 301 may be formed by thermal oxidation in an oxygen-containing atmosphere or oxygen plasma, take the bottom electrode of W as an example, with the oxidation temperature ranging from 200° C. to 500° C., the $WO_x$ formed has a thickness ranging from 1 nm to 50 nm.

Step S202, as shown in FIG. 2 and FIG. 3, the resistance-switching layer 303 is formed on the oxide layer 302 containing a bottom electrode metal. The embodiment of the present disclosure provides the resistance-switching layer 103 with the nitrogen-containing tantalum oxide material to improve the activation energy of O ion due to existing of the N ion center on the one hand, and enhance control capability over the device resistance by the number of oxygen vacancies on the other hand.

The nitrogen-containing tantalum oxide has a nitrogen content ranging from 0.05% to 30%, preferably, 1% to 10%. The resistance-switching layer 303 has a thickness ranging from 1 nm to 20 nm, preferably, 3 nm to 10 nm.

The resistance-switching layer 303 may be formed by the following methods:

A: forming the nitrogen-containing tantalum oxide on the oxide layer containing a bottom electrode metal by reactive sputtering; or, B: forming the nitrogen-containing tantalum oxide on the oxide layer containing a bottom electrode metal in an oxygen-containing or oxygen plasma atmosphere by thermal oxidation; or, C: forming the nitrogen-containing tantalum oxide on the oxide layer containing a bottom electrode metal in an atmosphere containing oxygen and nitrogen by thermal oxidation;

The following specific embodiments of the nitrogen-containing $WO_x$ are listed here to illustrate the formation process of the resistance-switching layer:

for example, the TaON resistive material may be deposited on the $WO_x$ by reactive sputtering, the initial resistance of the device may be adjusted by adjusting the nitrogen content, the thickness of TaON is ranging from 1 nm to 20 nm, and the N/O is ranging from 0.01 to 10. The TaON resistive material may also be formed by thermal oxidation of the TaN substrate in an oxygen-containing atmosphere or oxygen plasma, with the oxidation temperature ranging from 200° C. to 500° C., the TaON has a thickness ranging from 1 nm to 20 nm;

The TaON resistive material may be formed by thermal oxidation which heating the TaN or Ta substrate in an atmosphere containing oxygen or nitrogen plasma, with the oxidation temperature ranging from 200° C. to 500° C., the TaON has a thickness ranging from 1 nm to 20 nm.

Step S203, as shown in FIG. 3 and FIG. 2, the inserting layer 304 is formed on the resistance-switching layer 303, wherein the inserting layer material is a metal or a semiconductor.

The inserting layer material may be a metal such as Ta, TaN, Ti, TiN, Ir, Al, Ru, etc., or a semiconductor such as a metal oxide containing Ta, TaN, Ti, TiN, Ru or Ir; or an oxide of two or more metals of Ta, TaN, Ti, TiN, Ru and Ir. The inserting layer material can also be amorphous silicon, amorphous C, graphene, etc.

The thickness of the metal inserting layer may be ranging from 0.1 nm to 10 nm and the metal inserting layer may be formed by thermal evaporation, sputtering, chemical vapor deposition, pulsed laser deposition, or physical transfer. The inserting layer can generate oxygen ions during the surface retention operation to improve the fatigue characteristics of the device while keep the selection of the top electrode unlimited.

The inserting layer 304 has a thickness ranging from 0.1 nm to 10 nm, preferably, 0.5 nm to 5 nm.

Due to the existence of the inserting layer, the top electrode in step to S104 may be selected without limitation and fabricated by the know process and material from the prior art.

FIGS. 4A and 4B illustrate respectively an equivalent circuit diagram and a cross-sectional diagram of a memory cell of the RRAM according to an embodiment of the present disclosure. The memory cell of the RRAM fabricated by the above method is as shown in FIG. 4B. In the whole structure of the circuit, the structure of RRAM is shown in the dotted circle, including from bottom to top: the bottom electrode 401; the oxide layer 402 containing a bottom electrode metal, the resistance-switching layer 403, the inserting layer 404 and the top electrode 105. FIG. 4 An illustrates the equivalent circuit diagram of the RRAM.

The specific fabrication and experimental test is made as follows by selecting the bottom electrode of W, the resistance-switching layer of nitrogen-containing tantalum oxide and the inserting layer of Ta. In fact, the present disclosure may be implemented by various forms and should not be construed as limited to the embodiments described below. On the contrary, the specific embodiments provided make the present disclosure satisfy the applicable legal requirements.

Embodiment 1

Fabrication Process:

Step 1: forming $WO_x$ on W by using the reactive sputtering method. The $WO_x$ may be a $WO_3$ with a complete chemical composition ratio; sputtered $WO_x$ may be sputtered by WO3 alloy target which the chemical composition ratio may be controlled by adjusting the flow ratio of $Ar/O_2$ and the thickness is ranging from 1 nm to 50 nm;

Step 2: forming the TaON resistance-switching layer on $WO_x$. The TaON resistive material may be deposited on the $WO_x$ by reactive sputtering, the initial resistance of the device may be adjusted by adjusting the nitrogen content, the thickness of TaON is ranging from 1 nm to 20 nm, and the N/O is ranging from 0.01 to 10;

Step 3: forming the inserting layer on the TaON resistance-switching layer, which is formed by thermal evaporation with the material of metal, e.g., Ta.

Step 4: forming the top electrode on the inserting layer.

Figure 6:
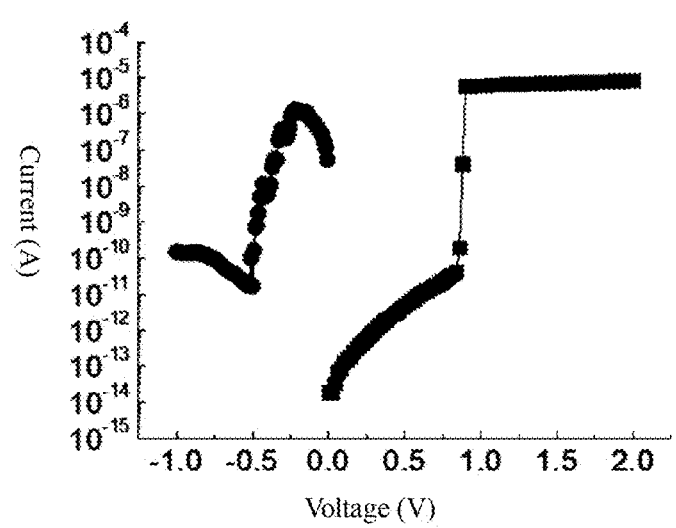
FIG. 6 illustrates a current-voltage curve of a RRAM according to an embodiment of the present disclosure.

Experimental Test:

FIG. 6 illustrates a current-voltage curve of a RRAM according to an embodiment of the present disclosure.

Compared with the current-voltage curve of a $Ta_2O_5$-based RRAM shown in FIG. 5, the TaON-based RRAM fabricated by the embodiment of the present disclosure has a low operation voltage and a high on-off ratio.

Although the purpose, technical solution and beneficial effects of the present disclosure have been described with reference to the above specific embodiments, it is to be understood that the embodiments described above are not intended to limit the present disclosure. Accordingly, any modification, equivalent substitution, improvement, etc., within the spirit and scope of the present disclosure is intended to be included within the scope of the present disclosure.

The invention claimed is:

1. A resistance random access memory (RRAM), comprising:
   a bottom electrode;
   an oxide layer containing a bottom electrode metal, disposed on the bottom electrode;
   a resistance-switching layer, disposed on the oxide layer containing a bottom electrode metal, wherein the resistance-switching layer material comprises a nitrogen-containing tantalum oxide;
   an inserting layer, disposed on the resistance-switching layer, wherein the inserting layer material comprises a metal or a semiconductor;
   a top electrode, disposed on the inserting layer.

2. According to the RRAM of claim 1, wherein the material of the bottom electrode comprises W, and the oxide layer containing a bottom electrode metal material comprises $WO_x$ where X is ranging from 1 to 3.

3. According to the RRAM of claim 1, wherein the oxide layer containing a bottom electrode metal has a thickness ranging from 1 nm to 30 nm.

4. According to the RRAM of claim 1, wherein the nitrogen atom content of the nitrogen-containing tantalum oxide is ranging from 0.05% to 30%.

5. According to the RRAM of claim 1, wherein the resistance-switching layer has a thickness ranging from 1 nm to 20 nm.

6. According to the RRAM of claim 1, wherein the inserting layer material is one of following types:
   Ta, TaN, Ti, TiN, Ru or Ir;
   two or more metals of Ta, TaN, Ti, TiN, Ru and Ir;
   a metallic oxide containing Ta, TaN, Ti, TiN, Ru or Ir;
   an oxide of two or more metals of Ta, TaN, Ti, TiN, Ru and Ir;
   amorphous silicon;
   amorphous carbon; or
   graphene.

7. A method for fabricating a resistance random access memory (RRAM), comprising:
   forming a bottom electrode;
   forming an oxide layer containing a bottom electrode metal on the bottom electrode;
   forming a resistance-switching layer on the oxide layer containing a bottom electrode metal, wherein the resistance-switching layer material comprises a nitrogen-containing tantalum oxide;
   forming an inserting layer on the resistance-switching layer, wherein the inserting layer material comprises a metal or a semiconductor;
   forming a top electrode on the inserting layer.

8. According to the method of claim 7, wherein the oxide layer containing a bottom electrode metal is formed by sputtering or a thermal oxidation.

9. According to the method of claim 7, wherein the resistance-switching layer is formed as follows:
   forming the nitrogen-containing tantalum oxide on the oxide layer containing a bottom electrode metal by reactive sputtering;
   or, forming the nitrogen-containing tantalum oxide on the oxide layer containing a bottom electrode metal in an oxygen-containing or oxygen plasma atmosphere by thermal oxidation;
   or, forming the nitrogen-containing tantalum oxide on the oxide layer containing a bottom electrode metal in an atmosphere containing oxygen and nitrogen by thermal oxidation.

10. According to the method of claim 7, wherein the inserting layer comprises Ta and has a thickness ranging from 0.1 nm to 10 nm.

* * * * *